United States Patent
Shih (10) Patent No.: US 7,329,914 B2
(45) Date of Patent: Feb. 12, 2008

(54) CHARGE TRAPPING MEMORY DEVICE WITH TWO SEPARATED NON-CONDUCTIVE CHARGE TRAPPING INSERTS AND METHOD FOR MAKING THE SAME

(75) Inventor: Yen-Hao Shih, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/884,483

(22) Filed: Jul. 1, 2004

(65) Prior Publication Data

US 2006/0001075 A1 Jan. 5, 2006

(51) Int. Cl.
  *H01L 29/76* (2006.01)
(52) U.S. Cl. ............ 257/288; 257/408; 257/411; 257/E29.255
(58) Field of Classification Search ........... 257/288, 257/387, 408, 410, 411, E29.255
  See application file for complete search history.

(56) References Cited

U.S. PATENT DOCUMENTS

| | | | |
|---|---|---|---|
| 5,021,999 | A | 6/1991 | Kohda et al. |
| 5,521,401 | A * | 5/1996 | Zamanian et al. ............ 257/67 |
| 6,011,725 | A | 1/2000 | Eitan |
| 6,037,627 | A * | 3/2000 | Kitamura et al. ........... 257/324 |
| 6,207,543 | B1 * | 3/2001 | Harvey et al. ............... 438/586 |
| 6,388,293 | B1 | 5/2002 | Ogura et al. |
| 6,620,656 | B2 * | 9/2003 | Min et al. ................. 438/149 |
| 6,885,072 | B1 * | 4/2005 | Jeng ........................ 257/412 |
| 7,049,189 | B2 * | 5/2006 | Chang et al. .............. 438/211 |
| 2002/0027254 | A1 * | 3/2002 | Kwean ........................ 257/382 |
| 2002/0142523 | A1 * | 10/2002 | Ryu et al. ................ 438/149 |
| 2004/0108537 | A1 * | 6/2004 | Tiwari ...................... 257/314 |
| 2005/0176203 | A1 * | 8/2005 | Chang et al. ............. 438/261 |

OTHER PUBLICATIONS

Z. Krivokapic et al., "Quantum-well Memory Device (QWMD) with Extremely Good Charge Retention," *IEDM*, 2002, pp. 185-188.

* cited by examiner

*Primary Examiner*—T. N. Quach
(74) *Attorney, Agent, or Firm*—Martine Penilla & Gencarella, LLP (57) ABSTRACT

A charge trapping memory device with two separated non-conductive charge trapping inserts is disclosed. The charge trapping memory device has a silicon substrate with two junctions. A gate oxide (GOX) is formed on top of the silicon substrate and between the two junctions. A polysilicon gate is defined over the GOX. A layer of bottom oxide (BOX) is grown on top of the silicon substrate and a conformal layer of top oxide (TOX) is grown along the bottom and the sidewalls of the polysilicon gate. Two charge trapping inserts are located beside the GOX and between the BOX and the TOX. The polysilicon gate needs to be at least partially over each of the two charge trapping inserts. The charge trapping inserts are made from a non-conductive charge trapping material. A method for fabricating such a device is also described.

7 Claims, 8 Drawing Sheets

FIG. 3B

CHARGE TRAPPING MEMORY DEVICE WITH TWO SEPARATED NON-CONDUCTIVE CHARGE TRAPPING INSERTS AND METHOD FOR MAKING THE SAME

BACKGROUND OF THE INVENTION

1. Field of the Invention

The present invention relates generally to a semiconductor memory device, and more particularly, to a charge trapping memory device with two separated non-conductive charge trapping inserts and a method for making such a device.

2. Description of the Related Art

As is well known in the art, a nitride read only memory (NROM) device uses an oxide-nitride-oxide (ONO) structure as the gate insulator as well as the charge trapping layer. A NROM device is programmed by injecting electrons into the nitride layer of the ONO structure via the channel hot electron (CHE) injection method. The trapped electrons in the nitride layer of the ONO structure can be erased by injecting holes into the place where the electrons are stored via the band-to-band hot (BTBH) hole injection method.

Although a NROM device is widely used in the semiconductor industry, it has the following drawbacks. First of all, a NROM device has a hard-to-erase problem after cycling. During the erasing process of an NORM device via the BTBH hole injection method, it is difficult to inject the holes to exactly where the electrons are trapped, and it is hard to match exactly the number of the trapped electrons with the number of injected holes, which leads to the phenomenon of the hard-to-erase problem. Next, an NROM device has wide threshold voltage $V_T$ distribution. In fabricating an NROM device, the plasma charging or UV-charging process can cause the initial $V_T$ to shift and broaden. If some of the injected electrons are shifted towards the center of the nitride layer of the ONO structure that is far away from the place where the electrons are injected, the initial wide $V_T$ distribution is further out of control. The wide $V_T$ distribution cannot be reset back to a lower state. Furthermore, an NROM device could have severe second bit effect. Because an NROM device is capable of 2-bit operation by storing two charges towards the ends of the nitride layer of the ONO structure, as the charges at both ends of the nitride layer of the ONO structure gets larger, the charges of both bits will interact with each other during a reverse read operation, which leads to the undesirable second bit effect. Finally, an NROM device has a hard-to-shrink problem due to the fact that its doping profile mainly controls the electron profile. Thus, the local charge profile will overlap with the other local charge profile, which makes an NROM device difficult to shrink.

Another prior art floating gate memory device utilizes two separated polysilicon inserts in the gate insulator next to the junctions. This floating gate memory device will have reliability problems such as stress-induced leakage current (SILC) and erratic bits.

In view of the foregoing, there is a need for a new charge trapping memory device and its fabrication method that will overcome the above-mentioned drawbacks of the NROM device and a floating gate memory device.

SUMMARY OF THE INVENTION

Broadly speaking, the present invention fills this need by providing a new charge trapping memory device with two separated non-conductive charge trapping inserts which are surrounded by oxide layers. A method for fabricating this new device is also described.

In accordance with one aspect of the present invention, a new charge trapping memory device is provided. This charge trapping memory device includes a silicon substrate with two junctions. A gate oxide (GOX) is formed on top of the silicon substrate and between the two junctions, and a polysilicon gate is defined over the GOX. A layer of bottom oxide (BOX) is grown on top of the silicon substrate, while a conformal layer of top oxide (TOX) is grown along the bottom and sidewalls of the polysilicon gate. Two charge trapping inserts are located beside the GOX and between the BOX and the TOX. The polysilicon gate is at least partially over each of the two charge trapping inserts. In one embodiment, two high density plasma oxide blocks are formed on top of the BOX and next to the two charge trapping inserts and the TOX. A layer of n-plus doped polysilicon is defined over the polysilicon gate and the two high density plasma oxide blocks.

In accordance with another aspect of the present invention, a method for fabricating such a new charge trapping memory device is also described. In this method, a silicon substrate having a layer of GOX formed thereon is provided. A polysilicon gate is defined over the GOX. Two undercut regions are formed at sidewalls of the GOX along the width of the GOX. In one embodiment, the two undercut regions are formed by the hydrofluoric acid during a self-limited etching process. An oxidation process causes a layer of BOX grown on top of the silicon substrate and a conformal layer of TOX grown along the bottom and sidewalls of the polysilicon gate. The BOX and the TOX are grown simultaneously. Two charge trapping inserts are formed by depositing a non-conductive charge trapping material into the two undercut regions. In one embodiment, a silicon nitride block is defined over the polysilicon gate to protect the polysilicon gate during the fabrication process. The silicon nitride block needs to be lifted off after the two charge trapping inserts are formed. In another embodiment, two high density plasma oxide blocks are formed on top of the BOX and next to the two charge trapping inserts and the TOX. Then, a layer of n-plus doped polysilicon is deposited over the polysilicon gate and the two high density plasma oxide blocks. Another layer of tungsten silicide is defined over the layer of n-plus doped polysilicon to reduce the resistance among the memory devices for a memory array structure.

This new charge trapping memory device avoids the drawbacks of a NROM device and a floating gate memory device mentioned previously. This new device has no erratic bit and no stress-induced leakage current because of the non-conductive property of the charge trapping material. It can precisely control the length of the charge trapping layer by controlling the length of the charge trapping inserts, which should be shorter than the length of the channel hot electron (CHE) injection or the band-to-band hot (BTBH) hole injection. The best location for the charge trapping inserts is where the CHE and the BTBH injection take place. As a result, it is easy to erase the charges trapped in this new device because the locations of the charges are known and the lengths of the charge trapping inserts are limited. Since the two charge trapping inserts are separated by the GOX that is a non-charge trapping material, the wide threshold voltage $V_T$ distribution problems and the initial $V_T$ shift problem can be corrected. Furthermore, because the charged regions are limited by the lengths of the charge trapping inserts rather by the injection ranges, which causes a narrower charge trapping region next to a junction, a relatively smaller read voltage is enough to overcome the second bit effect. In addition, since the charge profiles of this new charge trapping memory device are limited to the lengths of the charge trapping inserts, the two charge profiles will not overlap with each other. Thus, it is possible to shrink the charge trapping memory device.

The charge trapping inserts has a non-conductive charge trapping material property. The non-conductive charge trapping material can be any material that is capable of trapping a certain amount of charge so long as it is non-conductive. In one example, the non-conductive charge trapping material can be silicon nitride, aluminum oxide, hafnium oxide, etc. Of course, the exemplary non-conductive charge trapping materials are not intended to be exhaustive nor limit the invention to the precise materials provided for example purposes.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
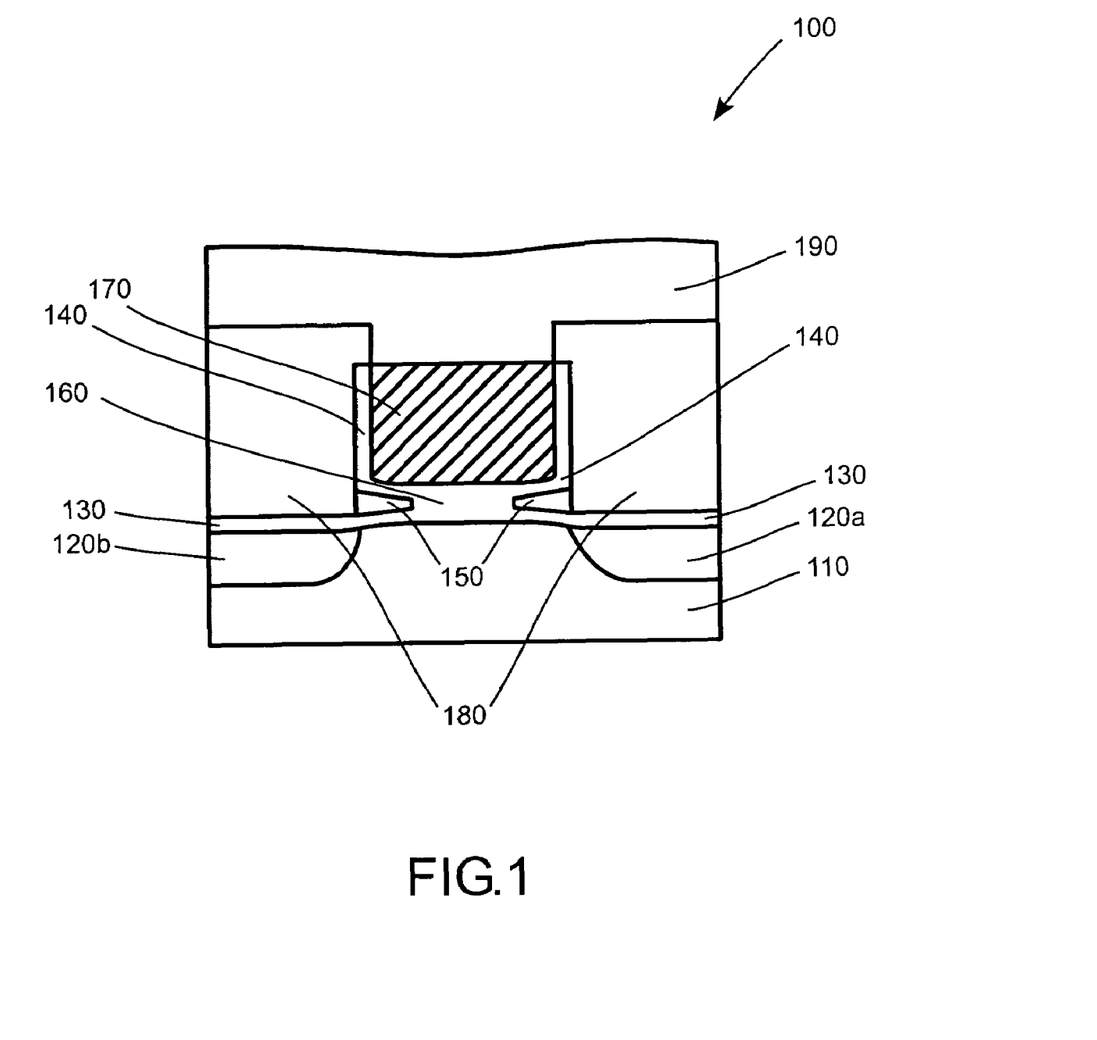
FIG. 1 illustrates a cross-sectional view of a charge trapping memory device in accordance with one embodiment of the present invention.

FIG. 1 is a cross-sectional view of a charge trapping memory device 100 in accordance with one embodiment of the present invention. As shown in FIG. 1, silicon substrate 110 has two doped junctions 120a and 120b. A gate oxide (GOX) 160 is formed on top of the silicon substrate 110 and between the two doped junctions 120a and 120b. A polysilicon gate 170 is defined over the GOX. A layer of bottom oxide 130 (BOX) is grown on top of the silicon substrate 110, while a conformal layer of top oxide (TOX) 140 is grown along the bottom and sidewalls of the polysilicon gate 170. Two charge trapping inserts 150 are located beside the GOX 160 and between the BOX 130 and the TOX 140. Two high density plasma oxide blocks 180 are formed on top of the BOX 130 and next to the two charge trapping inserts 150 and the TOX 140. A layer of n-plus doped polysilicon 190 is defined over the polysilicon gate 170 and the two high density plasma oxide blocks 180.

Figure 2A:
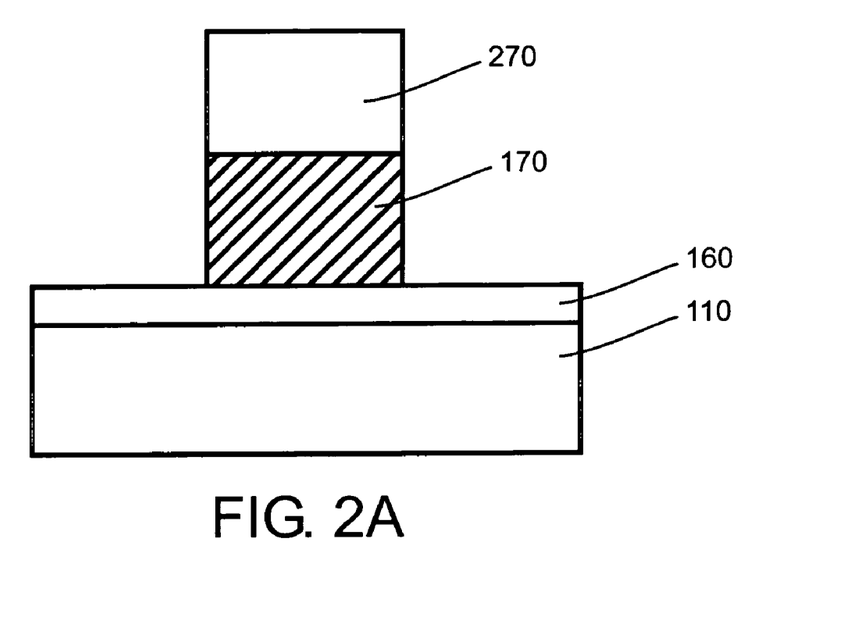
FIGS. 2A-2I illustrate an exemplary method for fabricating the charge trapping memory device shown in FIG. 1.

FIGS. 2A-2I illustrate an exemplary method for fabricating the charge trapping memory device 100 shown in FIG. 1. With reference to FIG. 2A, a silicon substrate 110 has a gate oxide (GOX) 160 formed thereon. A polysilicon gate 170 is formed on top of the GOX 160, while a silicon nitride block 270 is formed on top of the polysilicon gate 170. The silicon nitride block 270 is used to protect the polysilicon gate 170 during the fabricating process.

Figure 2B:
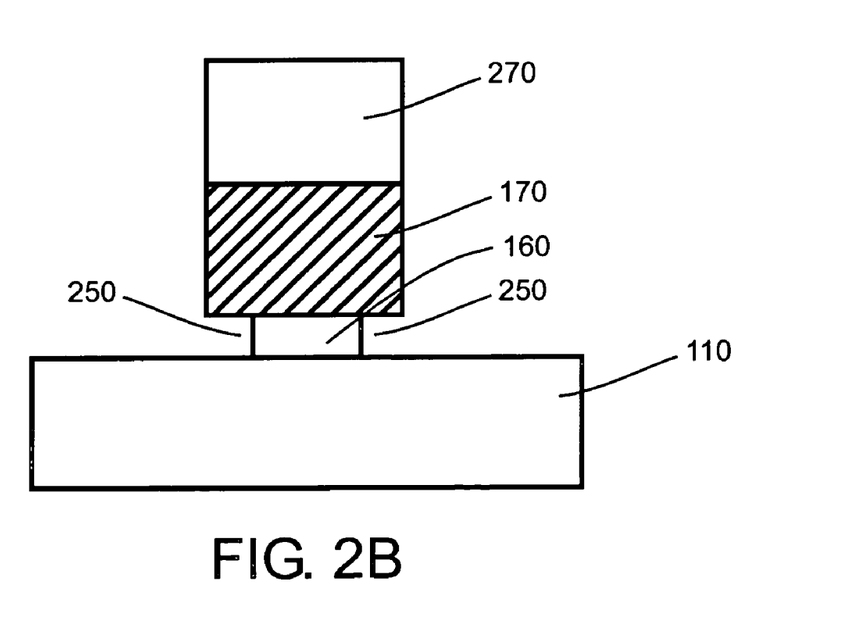

Next, as shown in FIG. 2B, two undercut regions 250 are defined by the sidewalls of the GOX 160, the bottom of the polysilicon gate 170, and the top of the substrate 110. The two undercut regions 250 extend a width along the width of the GOX 160. By way of example, hydrofluoric acid can be used to selectively and self-limitedly etch the sidewalls of the GOX 160 to create the two undercut regions 250 for a non-conductive charge trapping material deposition therein.

Figure 2C:
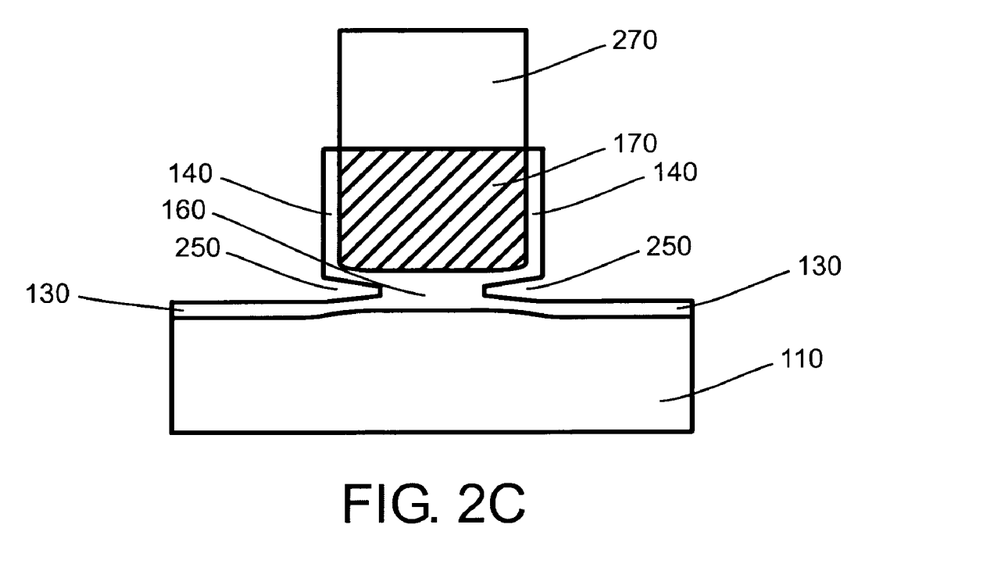

Turning to FIG. 2C, an oxidation process causes a layer of BOX 130 to grow on top of the substrate 110 and to define a conformal layer of TOX 140 along the bottom of the polysilicon gate 140 and the sidewalls of the polysilicon gate 140, and/or the silicon nitride block 270. In this embodiment, the BOX 130 and the TOX 140 are grown simultaneously. As shown, the oxidation process also causes the structure deformation on top of the substrate 110 and along the bottom and sidewalls of the polysilicon gate 170. The gaps of the undercut regions 250 become smaller due to the growth of the BOX 130 and the TOX 140.

Figure 2D:
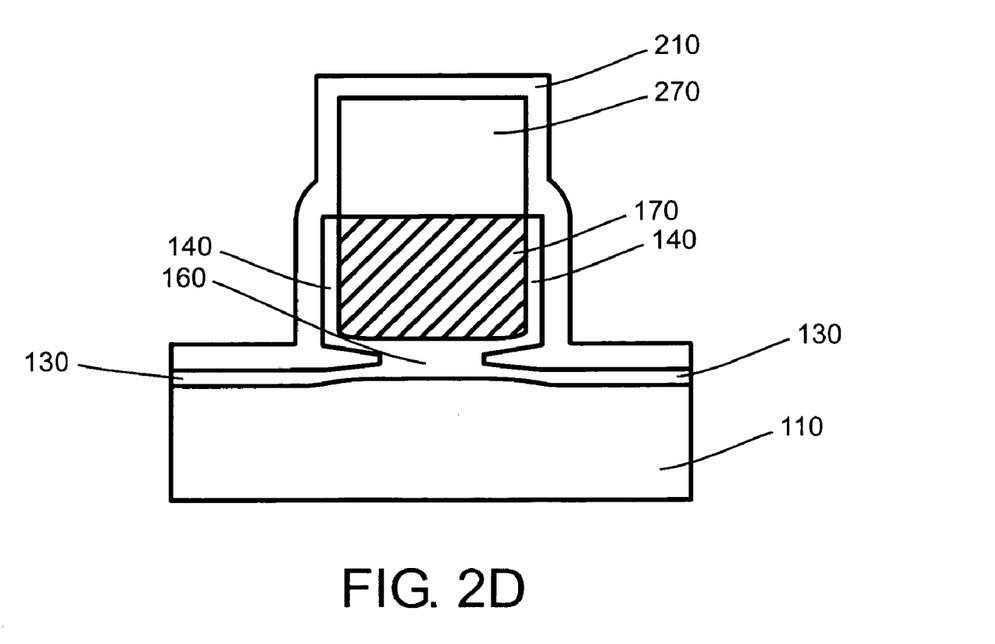

Referring now to FIG. 2D, a conformal layer of a non-conductive charge trapping material 210 is substantially deposited over the silicon nitride block 270 and extends to the substrate 110. The conformal layer of a non-conductive charge trapping material 210 fills the undercut region 250 completely. The non-conductive charge trapping material can be any material that is capable of trapping certain amount of charges so long as it is non-conductive. By way of an example, the non-conductive charge trapping material can be selected from silicon nitride, aluminum oxide, hafnium oxide, etc. Of course, the listed exemplary materials are not intended to be exhaustive or to limit the invention to the precise materials disclosed. In one embodiment, the deposition of the non-conductive charge trapping material can be performed by a low-pressure chemical vapor deposition (LPCVD) method. In another embodiment, the deposition of the non-conductive charge trapping material can be carried out by a liquid phase deposition (LPD) method.

Figure 2E:
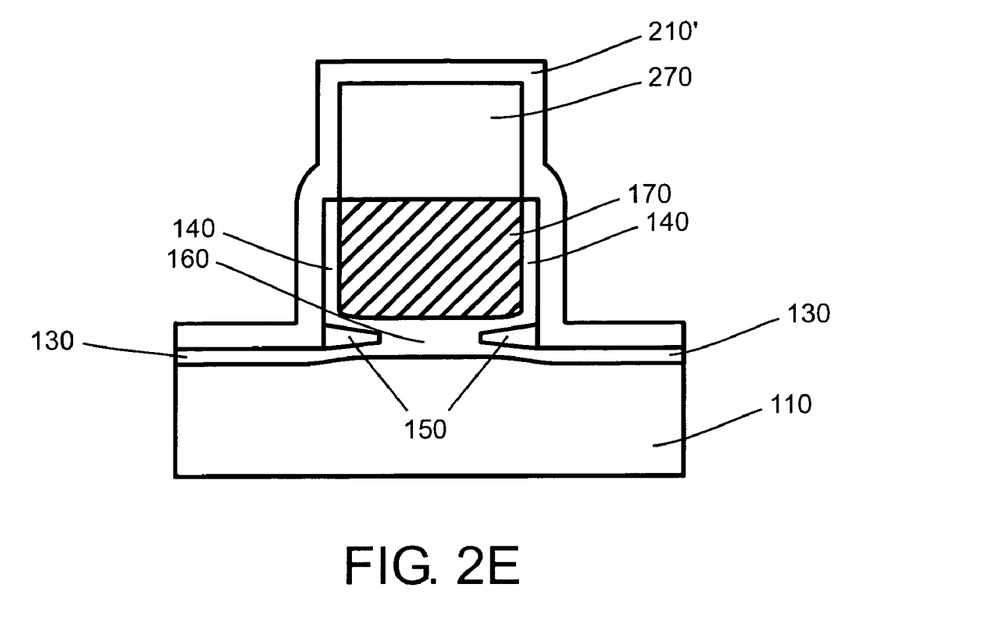

Referring next to FIG. 2E, the conformal layer of a non-conductive charge trapping material 210, nitride for example, is oxidized for a period of time until the outer portion of the conformal layer of a non-conductive charge trapping material 210 which encapsulates the silicon nitride 270 and extends to the substrate 110 is converted into an oxidized layer 210'. The conversion happens for the entire material 210, except for an inner portion of the conformal layer of a non-conductive charge trapping material 210 embedded at the undercut regions 250. As shown, the un-oxidized non-conductive charge trapping material embedded at the undercut regions 250 forms two charge trapping inserts 150. In alternative embodiment for nitride, aluminum oxide, and hafnium oxide, the outer portion of the conformal layer of a non-conductive charge trapping material 210 can be removed by a wet-etching process. In another embodiment, a thermal treatment is performed at the interface between each of the charge trapping inserts 150 and its surrounding oxide layers to enhance the charge trapping ability of the charge trapping inserts 150.

Figure 2F:
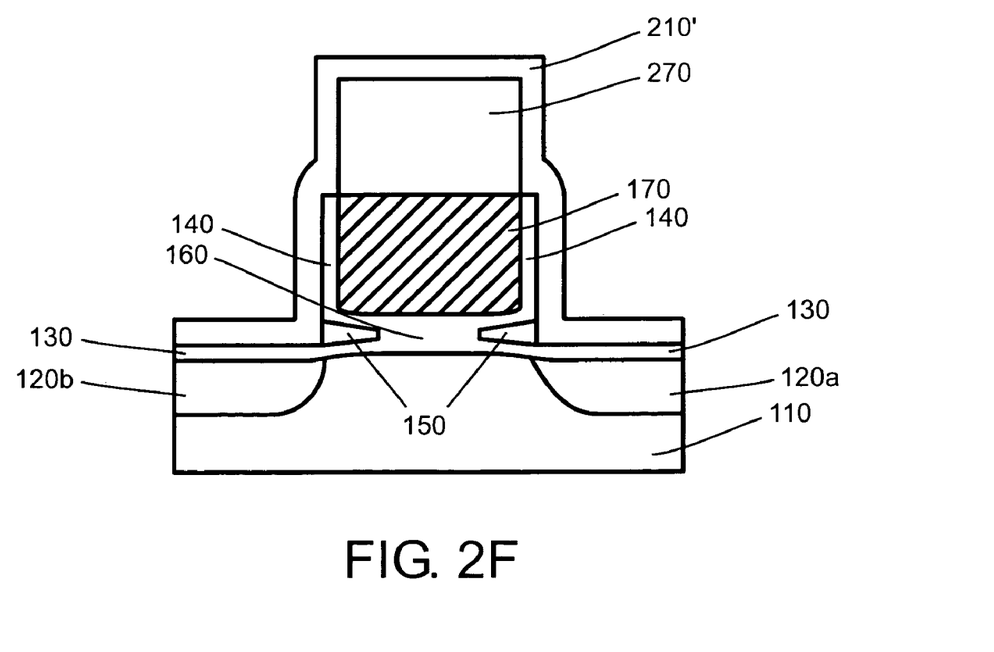

Continuing to FIG. 2F, two junctions 120a and 120b are implanted next to the two charge trapping inserts 150 on the silicon substrate 110 as shown.

Figure 2G:
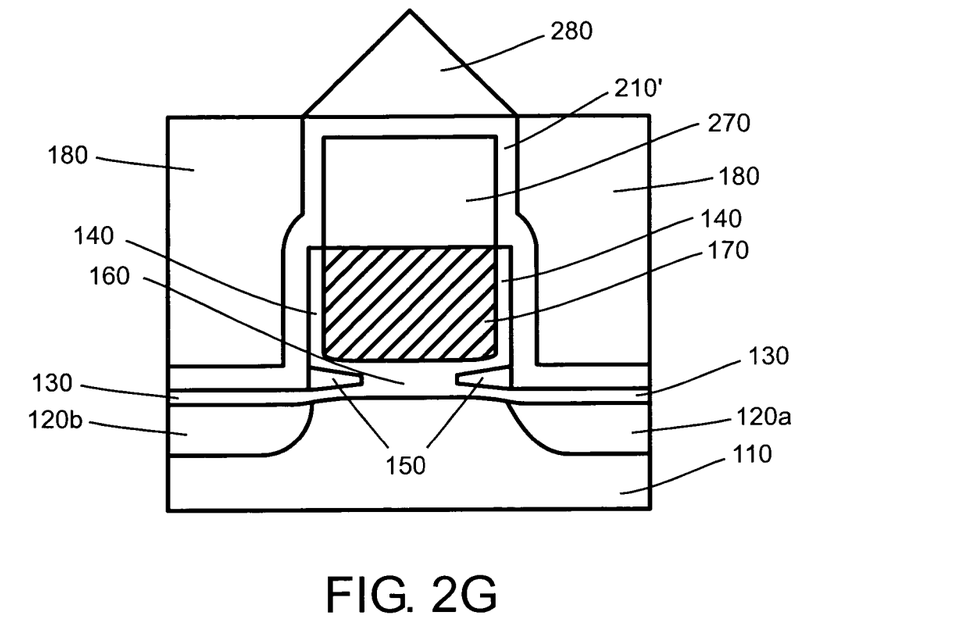

With reference to FIG. 2G, a high density plasma (HDP) oxidation process is performed to fill in the spaces beside the polysilicon gate 170 and the silicon nitride block 270. As a result, two high density plasma oxide blocks 180 are formed as shown. Preferably, the high density plasma oxide blocks 180 should be at least as high as the top of the silicon nitride block 270. As is common in HDP processes, after the spaces are filled, a high density plasma oxide 280 is shown in the form of a triangle over the higher feature profiles.

Figure 2H:
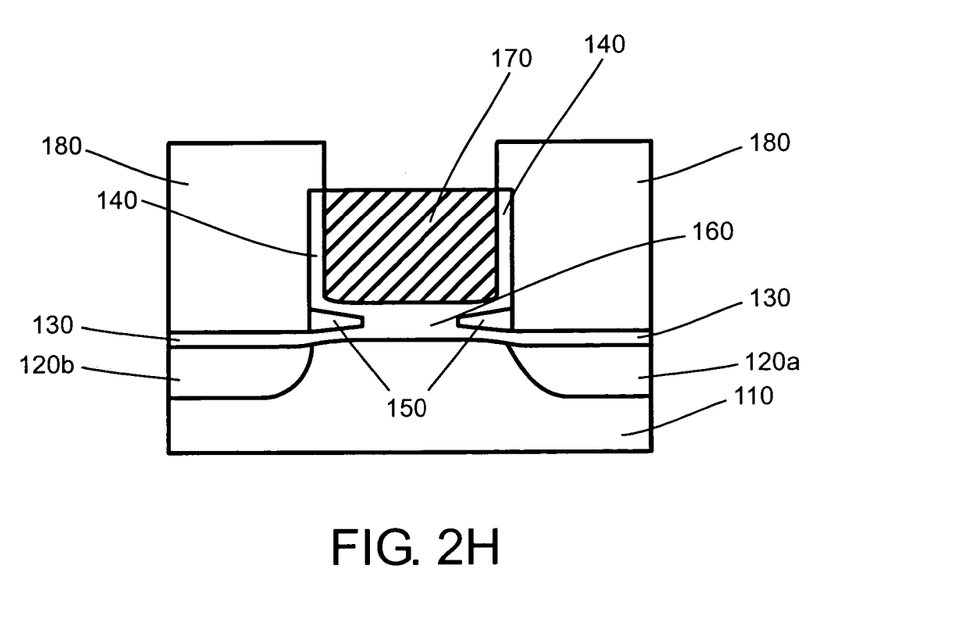

As shown in FIG. 2H, the top portions of the two high density plasma oxide blocks 180 and the excessive high density plasma oxide 280 are etched off by the hydrofluoric acid dipping process. Then, the silicon nitride block 270 is lifted off by the phosphoric acid etch. The hydrofluoric acid dipping process also removes the top portion of the oxidized layer 210'. Because the oxidized layer 210' and the high density plasma oxide blocks 180 are very similar oxide materials, for the simplicity of the illustration, the remaining oxidized layer 210' and the remaining high density plasma oxide blocks 180 are combined together and shown as the high density plasma oxide blocks 180 only.

Figure 2I:
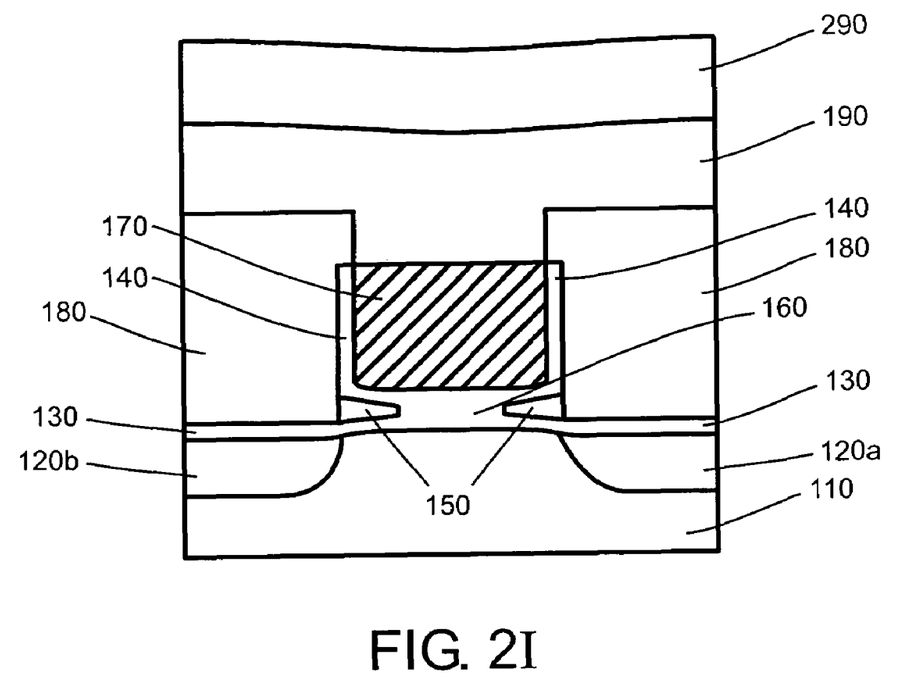

Referring to FIG. 2I, a layer of n-plus doped polysilicon 190 is deposited over the polysilicon gate 170 and the two high density plasma oxide blocks 180. Another layer of tungsten silicide 290 is defined over the layer of n-plus doped polysilicon 190 to reduce the line resistance between the memory devices. The layer of n-plus doped polysilicon 190 and the layer of tungsten silicide 290 extend along the width and the length of the charge trapping memory device.

Figure 3:
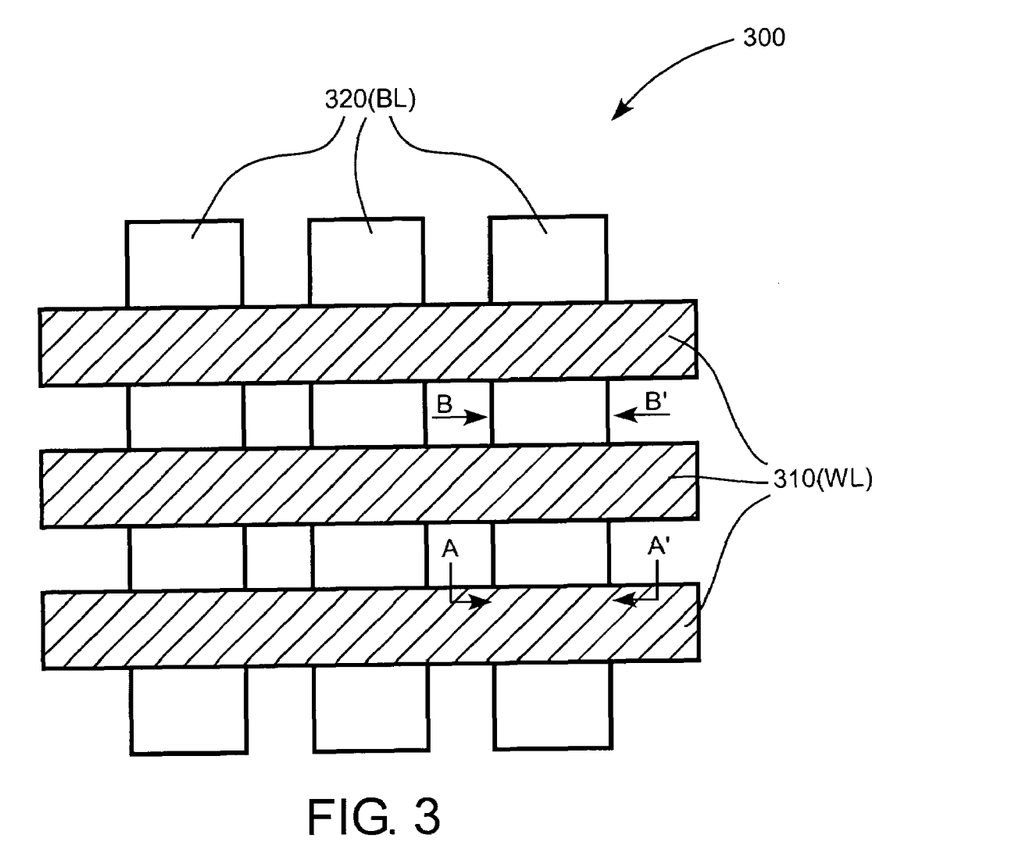
FIG. 3 is a top view of a charge trapping memory array structure with nine charge trapping memory devices fabricated by using the method illustrated in FIGS. 2A-2I.

FIG. 3 is a top view of a charge trapping memory array structure 300 with nine charge trapping memory devices fabricated by using the method illustrated in FIG. 2A-2I. The photolithographic patterning and the etching are performed to selectively etch away portions of the layer of n-plus doped polysilicon 190, the layer of tungsten silicide 290, and the polysilicon gate 170 to form multiple charge trapping memory devices. The un-etched portions of the charge trapping memory array structure 300 forms three lateral stripes, which are the word lines (WL) 310. The vertical stripes are bit lines (BL) 320 for this charge trapping memory array structure 300. As a result, nine charge trapping memory devices are formed at the intersections of the three bit lines and the three word lines.

Figure 3A:
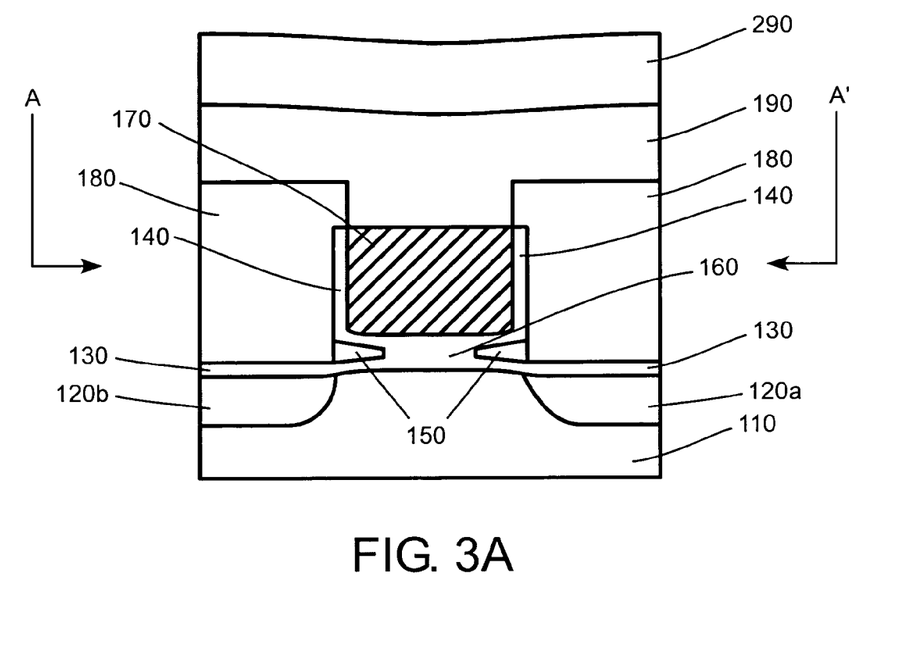
FIG. 3A is a cross-sectional view of the charge trapping memory array structure viewed from the A-A' line.

FIG. 3A is a cross-sectional view of the charge trapping memory array structure 300 viewed from the A-A' line, which is actually a cross-sectional view of one of the nine charge trapping memory devices. As shown, silicon substrate 110 has two doped junctions 120a and 120b. A GOX 160 is formed on top of the silicon substrate 110 and between the two doped junctions 120a and 120b. A polysilicon gate 170 is defined over the GOX. A layer of BOX 130 is grown on top of the silicon substrate 110, while a conformal layer of TOX 140 is grown along the bottom and sidewalls of the polysilicon gate 170. Two charge trapping inserts 150 are located beside the GOX 160 and between the BOX 130 and the TOX 140. Two high density plasma oxide blocks 180 are formed on top of the BOX 130 and next to the two charge trapping inserts 150 and the TOX 140. A layer of n-plus doped polysilicon 190 is defined over the polysilicon gate 170 and the two high density plasma oxide blocks 180. A layer of tungsten silicide 290 is defined over the layer of n-plus doped polysilicon 190.

Figure 3B:
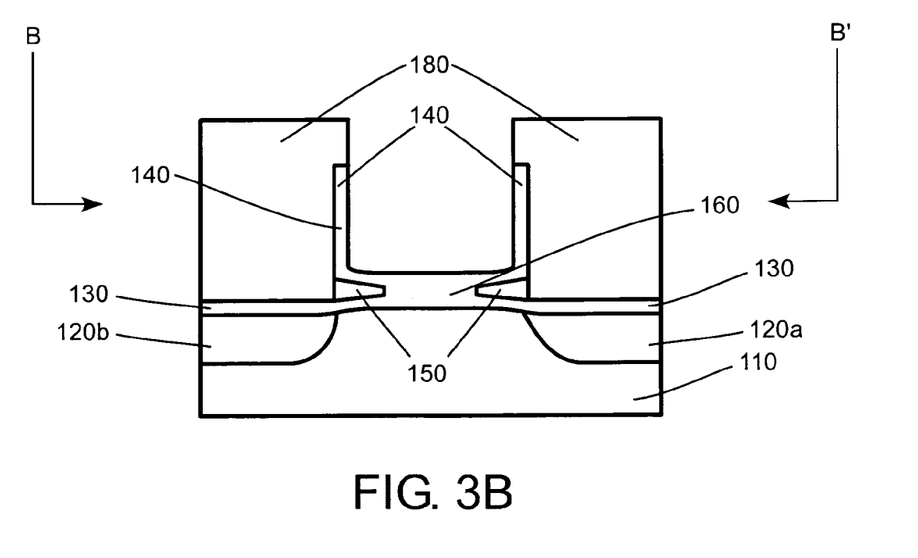
FIG. 3B is a cross-sectional view of the charge trapping memory array structure viewed from the B-B' line.

FIG. 3B is a cross-sectional view of the charge trapping memory array structure viewed from the B-B' line. In comparison with the FIG. 3A, the etching process etched away the layer of tungsten silicide 290, the layer of n-plus doped polysilicon 190, and the polysilicon gate 170 at this cross section marked by the B-B' line.

As illustrated, the charge trapping memory device 100 contains two separated non-conductive charge trapping inserts that are surrounded by oxide layers. Electrons and holes can be injected into the charge trapping inserts to alter the threshold voltage $V_T$ of the charge trapping memory device 100. The depth of the undercut regions 250 will define the lengths of the charge trapping inserts 150. The gap between the TOX 140 and the BOX 130 determines the thickness of the charge trapping inserts 150. In order to provide a precise control of the injected charges during programming, the lengths of the charge trapping inserts 150 need to be equal or shorter than the length of the channel hot electron (CHE) injection or the band-to-band hot (BTBH) injection. The best location for the charge trapping inserts 150 is where the CHE or the BTBH injection takes place. After the two charge trapping inserts 150 are charged, the reading of the two bits needs to use the reverse read scheme.

The charge trapping memory device 100 overcomes the problems of a NROM device and a floating gate memory device mentioned previously. Due to the non-conductive property of the charge trapping material used for the charge trapping inserts 150, no stress-induced leakage current exists in the charge trapping memory device 100. Unlike a floating gate memory device, the charge trapping memory device 100 is immune to erratic bit because the charge trapping memory device 100 uses two individual charge trapping inserts 150 to store charges. Since the two charge trapping inserts 150 are separated by the GOX 160 that is not capable of trapping any charges, the threshold voltage $V_T$ distribution can be precisely controlled. Consequently, $V_T$ shift caused by the Plasma charging or UV charging can be reset by charge injection. Furthermore, because the charged regions are limited by the lengths of the charge trapping inserts 150 rather by the injection ranges created by the CHE or the BTBH injection, which creates a narrower charge trapping region next to a junction, a relatively smaller read voltage is enough to screen out the second bit effect. As a result, the second bit effect is minor in this new charge trapping memory device 100. Finally, since the charge profiles are limited to the lengths of the charge trapping inserts 150, the two local charge profiles will not overlap with each other, which make the shrinkage of the charge trapping memory device 100 possible.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
a semiconductor substrate having a first and a second doped junctions formed therein;
an insulator layer having an oxide property on the semiconductor substrate and between the first and second doped junctions;
a first and a second inserts defined by a non-conductive charge trapping material, the first and second inserts being inserted inwardly into a first side and a second side of the insulator layer; and
a polysilicon gate defined over the insulator layer and at least partially over each of the first and second inserts,
wherein an outer edge of the first insert is vertically aligned with the first doped junction so that the first insert does not substantially overlap the first doped junction, and an outer edge of the second insert is vertically aligned with the second doped junction so that the second insert does not substantially overlap the second doped region.

2. The memory device as recited in claim 1, further comprising: first and second oxide blocks positioned respectively beside the first and second inserts, and defined over the substrate and next to side walls of the polysilicon gate.

3. The memory device as recited in claim 2, further comprising: a polysilicon layer defined over the polysilicon gate and the first and second oxide blocks.

4. The memory device as recited in claim 3, wherein the polysilicon layer is an impurity doped polysilicon layer.

5. The memory device as recited in claim 2, wherein the first and second oxide blocks are high-density plasma oxide blocks.

6. The memory device as recited in claim 1, wherein the non-conductive charge trapping material is selected from the group consisting of silicon nitride, aluminum oxide and hafnium oxide.

7. The memory device as recited in claim 1, wherein each of the first and second inserts is surrounded by oxide.

* * * * *